United States Patent
Hong et al.

(10) Patent No.: US 7,535,068 B2
(45) Date of Patent: May 19, 2009

(54) SELF-ASSEMBLY MICROSTRUCTURE WITH POLYIMIDE THIN-FILM ELASTIC JOINT

(75) Inventors: Alex Hong, Kaohsiung (TW); I Yu Huang, Kaohsiung (TW); Chih Hung Wang, Kaohsiung (TW)

(73) Assignee: Sunonwealth Electric Machine Industry Co., Ltd. (TW)

( * ) Notice: Subject to any disclaimer, the term of this patent is extended or adjusted under 35 U.S.C. 154(b) by 469 days.

(21) Appl. No.: 11/248,245

(22) Filed: Oct. 13, 2005

(65) Prior Publication Data
US 2007/0040229 A1    Feb. 22, 2007

(30) Foreign Application Priority Data
Aug. 17, 2005    (TW)    ............... 94128002 A

(51) Int. Cl.
*H01L 29/00* (2006.01)
*H01L 21/00* (2006.01)
(52) U.S. Cl. .................... 257/414; 438/48
(58) Field of Classification Search .......... 257/414
See application file for complete search history.

(56) References Cited

U.S. PATENT DOCUMENTS
6,174,820 B1 * 1/2001 Habermehl et al. ......... 438/745

OTHER PUBLICATIONS

Paul E. Kladitis et al., "Solder Self-Assembled Micro Axial Flow Fan Drive by a Scratch Drive Actuator Rotary Motor", IEEE, MEMS 2001 14th International Conference on Micro Electro Mechanical Systems, Jan. 21-25, 2001, pp. 598-601.*
Thorbjorn Ebefors et al., "New small radius joints based on thermal shrinkage of polyimide in V-grooves for robust self-assembly 3D microstructures", Journal of Micro-mechanical, Micro-engineering, vol. 8, 1998, pp. 188-194.*

* cited by examiner

*Primary Examiner*—W. David Coleman
(74) *Attorney, Agent, or Firm*—Bacon & Thomas, PLLC

(57) ABSTRACT

The invention relates to a self-assembly microstructure with a polyimide thin-film elastic joint, which contains at least one stationary part of the microstructure and at least one movable part of the microstructure. An elastic joint located between the stationary part and the movable part is a photosensitive polyimide thin film material. The polyimide elastic joint is contracted after high-temperature reflow process. The surface tension force of cured polyimide can rotate and lift-up the movable part of the microstructure in completion of the self-assembly of the microstructure.

10 Claims, 4 Drawing Sheets

SELF-ASSEMBLY MICROSTRUCTURE WITH POLYIMIDE THIN-FILM ELASTIC JOINT

FIELD OF THE INVENTION

The invention presents a self-assembly microstructure with polyimide thin film as elastic joint, which utilizes an integrated miniaturized planar technology with simple, fast and economical characteristics so as to solve the shortcomings of the conventional self-assembly technology.

BACKGROUND OF THE INVENTION

The development and application of the miniaturization technology is the major trend of modern science, and the self-assembly technology, in particular, is the rudimentary method of the microscopic world in the recent years.

Speaking of the micro rotary fan manufactured by Micro-electromechanical systems (MEMS) technology, as shown in Appendix 1, the portion between the Scratch Drive Actuator (SDA) of the micro rotary fan and the micro blades structure must be implemented by virtue of the self-assembly technology and multi-user MEMS processes (MUMPs).

The so-called self-assembly technology means that the microstructure will self-align after the completion of the final release process. As shown in Appendix 2, the conventional microstructure fabricated by using of self-assembly technology has the following three types.

Type 1 uses the residual stress from the manufacturing process to generate the deformation resulting in the displacement of microstructure as shown in FIG. 1 of Appendix 2, which illustrates a 3D micro-optic switch developed by Lucent Technology.

Type 2 uses surface acoustic wave generated by ultrasonic wave to move the microstructure to a preset position by vibration as shown in FIG. 2 of Appendix 2.

Type 3 uses the solder ball, photoresist or other polymer to form an elastic joint on the micro-hinge. A molten state of the elastic joint will be present under high temperature reflow process so as to generate a surface tension force pulling up the microstructure as shown in FIG. 3 of Appendix 2.

However, type 1 and type 2 of the traditional self-assembly technology are only applicable to the static application or the fixed microstructure, but not suitable for dynamic or rotated microstructure such as the micro-fan application.

In regard to type 3 self-assembly technology, there are a host of materials suitable for elastic joint fabrication. Different materials featured respective advantages. Take the solder ball as an example:

Lead contamination: The solder ball is composed of tin and lead (63Sn/37Pb). During the reflow process, facilities and environment will be contaminated by lead.

High cost: Most of the surface micromachined microstructures are usually constructed by polycrystalline silicon (Poly-Si), where a layer of gold pad must be coated as an interconnection between the solder ball and Poly-Si. This additional process will inevitably result in production difficulty and cost increasing.

Poor precision: To calculate the raised angle or displacement of microstructure, the dimension of solder ball must be accurately controlled. However, traditional solder ball usually has a volume deviation up to 25%, which makes the precision of the raised angle or displacement uncontrollable.

Manual processing: So far, attaching the solder ball on the gold pad still adopts the manual alignment processing.

Miniaturizing infeasibility: Currently, the smallest diameter of solder ball is no less than 100 μm, which limits the minimum size of the solder-based devices.

Taking the elastic joint formed by photoresist as another example:

The manufacturing process of the elastic joint formed by photoresist is not as complicated as that of the solder ball, and the cost thereof is also lower. However, the release of the microstructure must be processed by dry or wet etching.

The dry etching utilizes liquid carbon dioxide to release the microstructure and replace the water molecule so as to avoid the stick effect of the microstructure. Whereas, the super critical $CO_2$ dry release equipment used for the method is quite expensive, and thus the cost of this process is relatively high.

The wet etching requires no additional manufacturing equipment, making it a solution with less cost. However, after etching the sacrificial layer with the solution of diluted hydrofluoric acid (HF) or buffered oxide etch (BOE), further apply the isopropyl alcohol (IPA) to quickly vaporize the water molecules. The IPA is characterized by dissolving the photoresist so that it will damage the photoresist-based elastic joint fabricated originally.

In sum, considering production cost, process integration and miniaturization capability, a brand new manufacturing process is urgently required to resolve various shortcomings arising from the elastic joint formed by the solder ball or the photoresist.

SUMMARY OF THE INVENTION

In view of this, the invention provides a polyimide-based thin film self-assembly technology, including five process steps described as follows: (1) deposits a sacrificial layer and a low-stress microstructure layer on a silicon substrate; (2) patterns and etches the low-stress microstructure layer to provide a stationary part and a movable part of the microstructure; (3) coats a photosensitive polyimide thin film as elastic joint of the microstructure layer and defines its shape by using photolithography technique; (4) releases the sacrificial layer beneath the movable part of microstructure layer by wet etching; (5) lastly proceeds the reflow process of polyimide to result in the contraction of the elastic joint further to rotate and lift the movable part in completion of the self-assembly of the microstructure. As the invention can be extensively applied to a myriad of miniaturizing industries, it can solve all the drawbacks of the prior art and satisfy the requirements of low cost, simple manufacturing process and miniaturization.

BRIEF DESCRIPTION OF THE DRAWINGS

FIG. 1 is a schematic diagram showing the manufacturing processes of the present invention;

DETAILED DESCRIPTION OF THE PREFERRED EMBODIMENT

Figure 1:
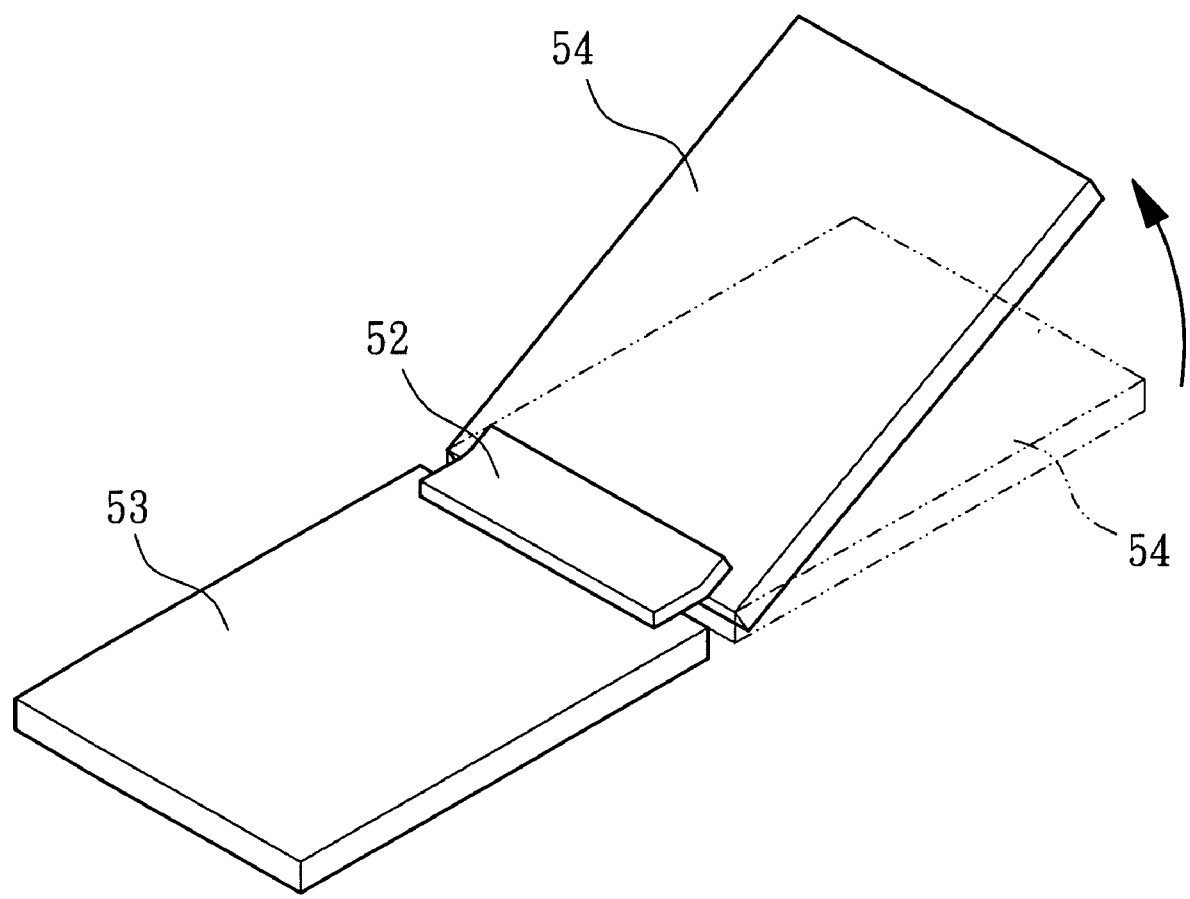
FIG. 1 is a schematic diagram showing a lift-up microstructure on silicon substrate of the present invention.

The invention relates to a polyimide thin film self-assembly microstructure as shown in FIG. 1, which contains at least one stationary part 53 of the microstructure and at least one movable part of the microstructure. An elastic joint 52 located between the stationary part 53 and the movable part 54 is a photosensitive polyimide thin film material. The polyimide elastic joint 52 is contracted after high-temperature reflow process. The surface tension force of cured polyimide can rotate and lift-up the movable part 54 of the microstructure in completion of the self-assembly of the microstructure.

Figure 2:
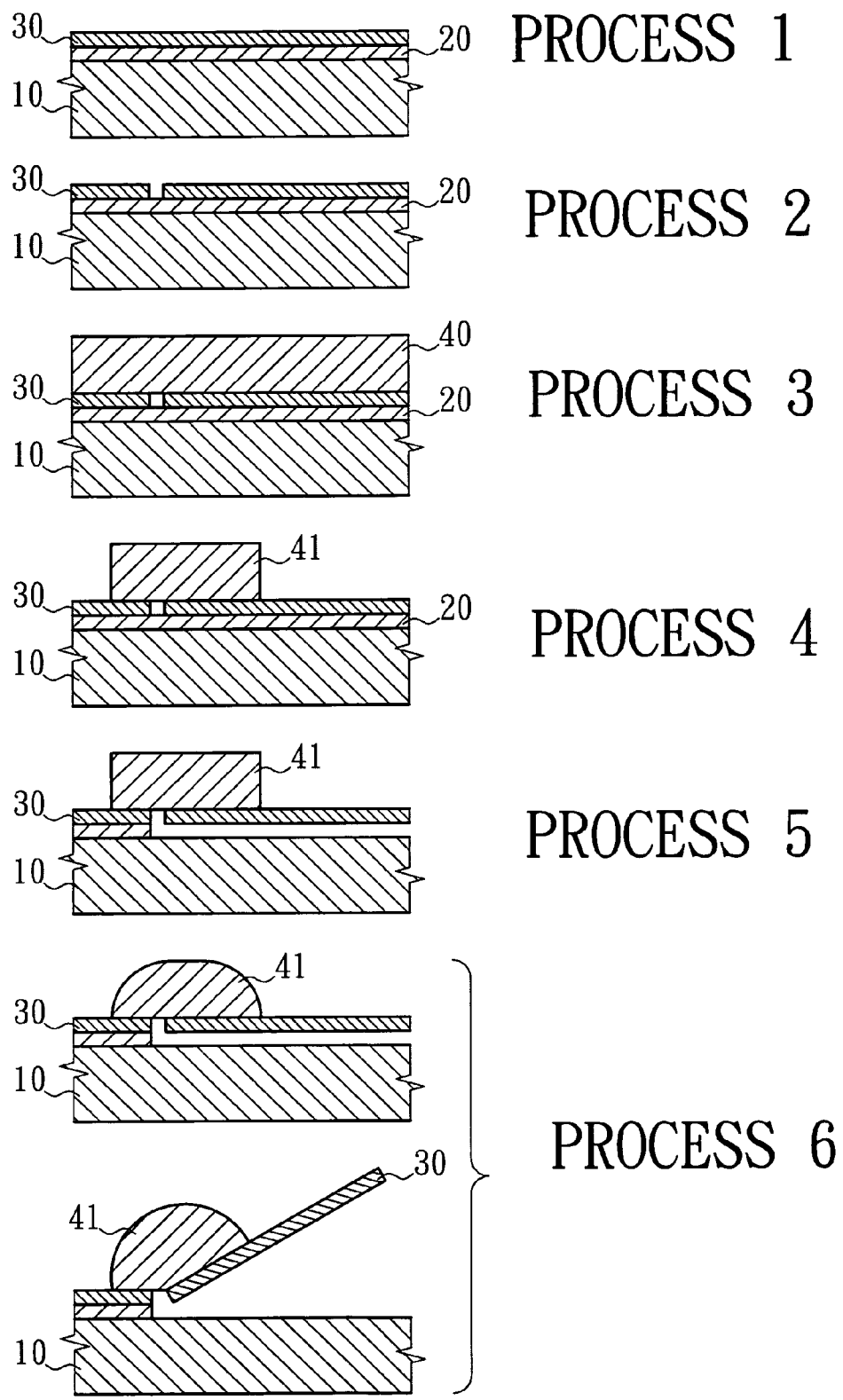

As shown in FIG. 2, the manufacturing processes of the self-assembly microstructure of the present invention described as follows:

process 1: depositing an phosphosilicate glass (PSG) on the silicon substrate 10 as the sacrificial layer 20 by means of the Plasma Enhanced Chemical Vapor Deposition (PECVD) system and further depositing the low-stress Poly-Si on the sacrificial layer 20 as the microstructure layer 30 by means of the Low Pressure Chemical Vapor Deposition (LPCVD) system;

process 2: carrying out the first photolithography process and etching the microstructure layer 30 to define the entire contour by using an Inductively Coupled Plasma (ICP) etching system;

process 3: using the spin coater to deposit a photosensitive polyimide thin film 40 on the microstructure layer 30;

process 4: carrying out the second photolithography process to define the shape of the polyimide elastic joint 41;

process 5: immersing the wafer in the BOE to carry out the wet etching of the pre-defined portion of the sacrificial layer 20 then release the microstructure layer; and process 6: carrying out the reflow process of polyimide thin film by using high temperature oven, results in a molten state of the elastic joint 41 under 380° C.~405° C. high temperature. The heated polyimide elastic joint 41 generates a contracted deformation to rotate and lift the pre-defined portion of the Poly-Si microstructure layer 30 as shown in Appendix 3.

First of all, compare the pros and cons of the polyimide elastic joint formed by the present invention and the solder ball respectively.

The present invention has no lead pollution.

The present invention requires no additional gold pad coated for the connection interface so as to address a simple and inexpensive manufacturing process.

The invention can conduct the alignment with rather high precision by virtue of the photolithography technique so as to provide a better precision.

The invention can perform an integrated miniaturized planar self-assembly processing.

The miniaturized size of the present invention has no limitation.

Furthermore, compare the pros and cons of the polyimide elastic joint formed by the present invention and photoresist.

Although photosensitive polyimide and photoresist are categorized as polymer materials, polyimide has a greater surface tension force which raised a larger angle of the same microstructure layer. Consequently, the present invention is free of the concern that the elastic joint is damaged by being dissolved in IPA.

As the photosensitive polyimide thin film is better in withstanding the organic solution, it can be developed to an inexpensive wet etching process. Therefore, the fabrication cost of the invention is relatively low.

In summary, the invention can simplify the manufacturing process, lower the cost and completely solve the shortcomings arising from the elastic joint formed by the solder ball or photoresist.

Figure 3:
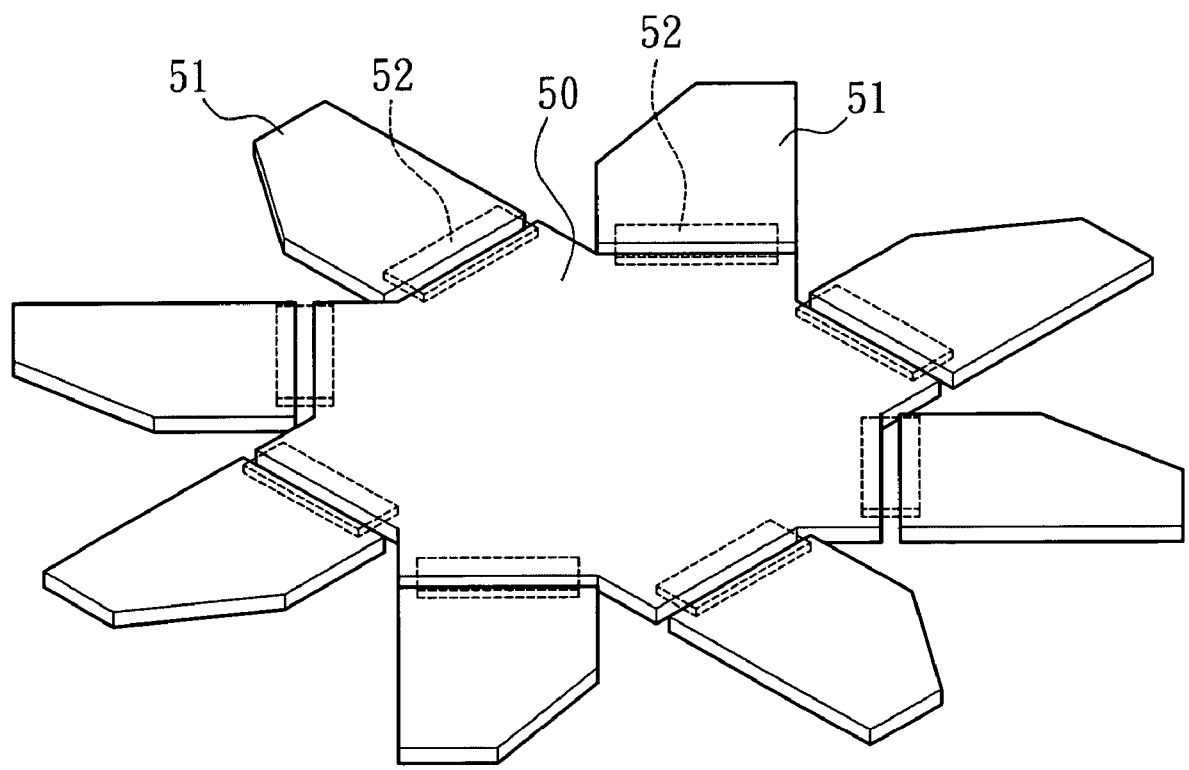
FIG. 3 is a schematic diagram (I) showing the application of present invention for the self-assembly unreleased micro-fan.
Figure 4:
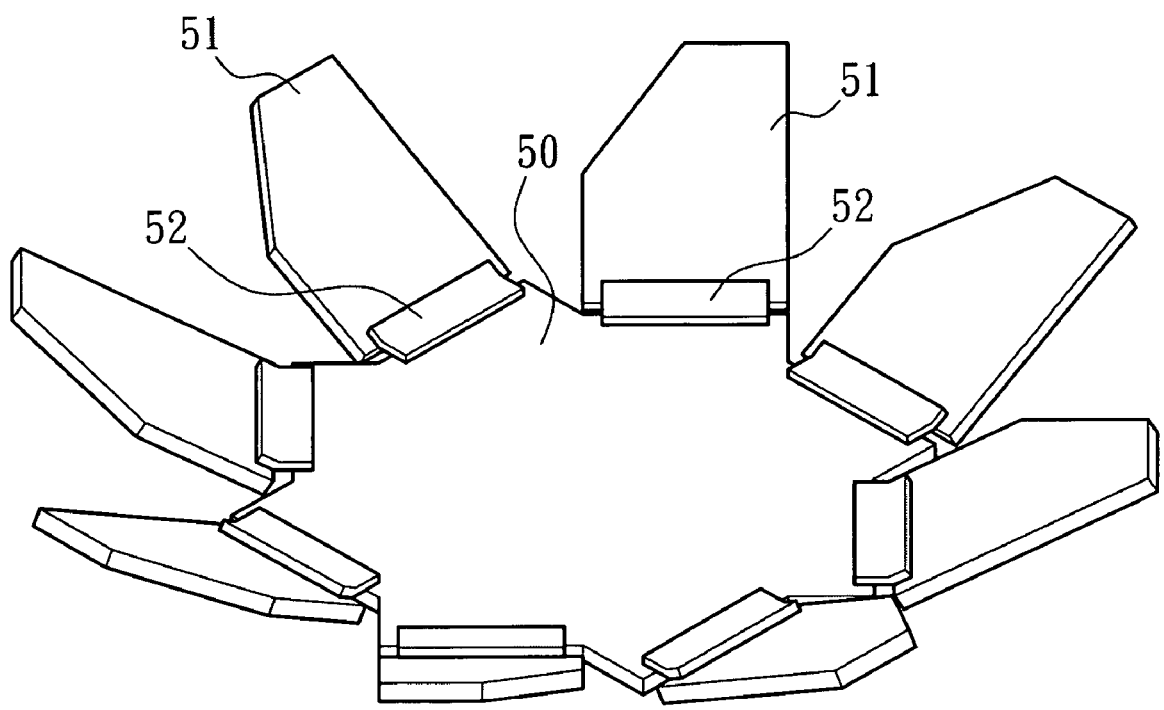
FIG. 4 is a schematic diagram (II) showing the application of present invention for the self-assembly released micro-fan.

Illustrated below are the self-assembly processes of the micro-blade structure for the micro-fan application:

Firstly, depositing a phosphosilicate glass (PSG) sacrificial layer on a silicon substrate and depositing a low stress microstructure layer on the said sacrificial layer;

As shown in FIG. 3, patterning and etching the Poly-Si microstructure layer to form the main body 50 and the micro-blades 51 of the micro-fan by virtue of a photolithography process;

Coating a photosensitive polyimide thin film on the microstructure layer;

Patterning and etching the polyimide thin film to form an elastic joint 52 between micro-blade 51 and main body 50 by using of photolithography process;

Carrying out a wet etching process to etch the sacrificial layer beneath micro-blade layer and release the micro-blade structure 51;

Lastly proceeds the reflow process of polyimide to result in the contraction of the elastic joint 52 further to rotate and lift the micro-blade 51 in completion of the self-assembly of the microstructure.

By means of the aforementioned polyimide-based microstructure design, the present invention totally resolves the various shortcomings arising from the solder ball or the photoresist based microstructure. As the invention can be extensively applied to a myriad of miniaturizing industries, it can solve all the drawbacks of the prior art and satisfy the requirements of low cost, simple manufacturing process and miniaturization. Accordingly, the present invention is not only a novelty and a progress but also has an industry utility.

What is claimed is:

1. A self-assembly microstructure comprising:
   at least a stationary part of the microstructure layer; and
   at least a movable part of the microstructure layer; both of said
   parts formed of a polycrystalline silicon, and;
   wherein the said stationary part and the said movable part use an integrated polyimide thin film as an elastic joint on the microstructure layer after high-temperature reflow process, a large surface tension force is generated from the said elastic joint to rotate and lift-up the said movable part of the said microstructure.

2. The self-assembly microstructure with a polyimide thin film elastic joint of claim 1 is applied to a self-assembly of a micro-fan.

3. The self-assembly microstructure with a polyimide thin film elastic joint of claim 1 is applied to a self-assembly of a scratch drive actuator.

4. The self-assembly microstructure with a polyimide thin film elastic joint of claim 1, wherein the fabrication processes of the said microstructure comprises:
   a. depositing a sacrificial layer on a silicon substrate and depositing a low stress polycrystalline silicon microstructure layer on the said sacrificial layer;
   b. patterning and etching a low-stress microstructure form on the said sacrificial layer;
   c. coating a polyimide thin film on the said microstructure layer;
   d. patterning and etching an elastic joint form on the said polyimide thin film;
   e. carrying out a wet etching process to etch and release a pre-defined portion of the said sacrificial layer; and
   f. carrying out a reflow process to result in a contraction of the said elastic joint to rotate and lift a pre-defined portion of the said microstructure layer.

5. The self-assembly microstructure with a polyimide thin film elastic joint of claim 2, wherein the said micro-fan comprises a main body and a set of micro-blades, the said elastic joint is formed between the said main body and the said micro-blades with the said polyimide thin film, and the said surface tension force is generated from the said elastic joint by means of the said reflow process to rotate and lift the said micro-blades.

6. The self-assembly microstructure with a polyimide thin film elastic joint of claim 4, wherein the said sacrificial layer is a phosphosilicate glass (PSG).

7. The self-assembly microstructure with a polyimide thin film elastic joint of claim 4, wherein the said low-stress microstructure layer is a polycrystalline silicon (Poly-Si).

8. The self-assembly microstructure with a polyimide thin film elastic joint of claim 7, wherein the said sacrificial layer is a phosphosilicate glass (PSG).

9. The self-assembly microstructure of claim 8 wherein the polyimide is photosensitive.

10. A self-assembly microstructure fan comprising:

a crystalline polysilicon microstructure planar hub layer; and attached to the hub layer by an elastic joint, at least one blade having a crystalline polysilicon microstructure; and wherein the elastic joint is an integrated polyimide thin film on the microstructure layer which generated a large surface tension force to rotate and lift-up the blade out of the plane of the planar hub.

* * * * *